(12) United States Patent
Hishinuma et al.

(10) Patent No.: US 10,438,774 B2
(45) Date of Patent: Oct. 8, 2019

(54) ETCHING METHOD AND PLASMA PROCESSING APPARATUS

(71) Applicant: Tokyo Electron Limited, Tokyo (JP)

(72) Inventors: Hayato Hishinuma, Miyagi (JP); Hisashi Hirose, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/817,774

(22) Filed: Nov. 20, 2017

(65) Prior Publication Data

US 2018/0158654 A1 Jun. 7, 2018

(30) Foreign Application Priority Data

Dec. 2, 2016 (JP) ................... 2016-235363

(51) Int. Cl.
| | | |
|---|---|---|
| *H01J 37/32* | (2006.01) | |
| *H01L 21/4757* | (2006.01) | |
| *H01L 21/04* | (2006.01) | |
| *H01L 21/311* | (2006.01) | |
| *H01L 21/306* | (2006.01) | |
| *H01L 21/3213* | (2006.01) | |
| *H01L 21/768* | (2006.01) | |
| *H01L 21/3065* | (2006.01) | |
| *H01L 21/02* | (2006.01) | |
| *C30B 33/12* | (2006.01) | |

(52) U.S. Cl.
CPC ........ *H01J 37/32174* (2013.01); *C30B 33/12* (2013.01); *H01J 37/321* (2013.01); *H01J 37/32091* (2013.01); *H01L 21/0212* (2013.01); *H01L 21/042* (2013.01); *H01L 21/3065* (2013.01); *H01L 21/30621* (2013.01); *H01L 21/311* (2013.01); *H01L 21/31116* (2013.01); *H01L 21/32135* (2013.01); *H01L 21/32136* (2013.01); *H01L 21/32137* (2013.01); *H01L 21/47573* (2013.01); *H01L 21/76826* (2013.01)

(58) Field of Classification Search
None
See application file for complete search history.

(56) References Cited

U.S. PATENT DOCUMENTS

| | | | | |
|---|---|---|---|---|
| 2014/0193969 A1* | 7/2014 | Hull | ...................... | H01L 29/401 438/591 |
| 2015/0011094 A1* | 1/2015 | Narishige | ......... | H01L 27/11556 438/723 |
| 2015/0287618 A1* | 10/2015 | Matsumoto | ....... | H01L 21/31116 156/345.24 |

FOREIGN PATENT DOCUMENTS

| | | |
|---|---|---|
| JP | 2009-170661 | 7/2009 |
| JP | 2009-266944 | 11/2009 |
| JP | 2014-090022 | 5/2014 |

* cited by examiner

Primary Examiner — Stephanie P Duclair
(74) Attorney, Agent, or Firm — IPUSA, PLLC

(57) ABSTRACT

An etching method is provided for processing a substrate that includes a first region having an insulating film arranged on a silicon layer and a second region having the insulating film arranged on a metal layer. The etching method includes a first step of etching the insulating film into a predetermined pattern using a plasma generated from a first gas until the silicon layer and the metal layer are exposed, and a second step of further etching the silicon layer after the first step using a plasma generated from a second gas including a bromide-containing gas.

14 Claims, 13 Drawing Sheets

FIG.2

| | INITIAL | CONVENTIONAL GAS ($CF_4/Ar/O_2$) |
|---|---|---|
| DEEP HOLE (CS) | | |
| Si RECESS | 30 nm | 58 nm (Δ 28 nm) |
| SHALLOW HOLE (CC) | | |
| W LOSS | 4 nm | 26 nm (Δ 22 nm) |
| Si/W SEL. | – | 1.3 |

FIG.4

| | INITIAL | HBr | Cl$_2$/Ar | SiCl$_4$/Ar | SiF$_4$/Ar |
|---|---|---|---|---|---|
| DEEP HOLE (CS) | | | | | |
| Si RECESS | 30 nm | 143 nm (Δ113 nm) | 46 nm (Δ16 nm) | - | - |
| SHALLOW HOLE (CG) | | | | | |
| W LOSS | 4 nm | 24 nm (Δ20 nm) | 18 nm (Δ14 nm) | - | - |
| Si/W SEL. | - | 5.7 | 1.1 | N/A | N/A |

FIG.5

|  | INITIAL | CHF$_3$ | CH$_2$F$_2$ | NF$_3$/Ar | SF$_6$/Ar | HBr | Cl$_2$/Ar |
|---|---|---|---|---|---|---|---|
| Si RECESS (nm) | 30 | 34 | 34 | 58 | 56 | 143 | 46 |
| W LOSS (nm) | 4 | 8 | 8 | 28 | 18 | 24 | 18 |
| Si/W SEL. | — | 1.0 | 1.0 | 1.2 | 1.9 | 5.7 | 1.1 |

FIG.7

| | INITIAL | HBr + C$_4$F$_6$ FLOW RATE RATIO 0 | HBr + C$_4$F$_6$ FLOW RATE RATIO 0.035 | HBr + C$_4$F$_6$ FLOW RATE RATIO 0.07 |
|---|---|---|---|---|
| DEEP HOLE (CS) | | | | |
| Si RECESS | 30 nm | 143 nm (Δ113 nm) | 107 nm (Δ77 nm) | 107 nm (Δ77 nm) |
| SHALLOW HOLE (CC) | | | | |
| W LOSS | 4 nm | 24 nm (Δ20 nm) | 16 nm (Δ12 nm) | 8 nm (Δ4 nm) |
| Si/W SEL. | — | 5.7 | 6.4 | 19 |

FIG.10

| | INITIAL | HBr + CH₄ FLOW RATE 0 | HBr + CH₄ FLOW RATE 0.25 |
|---|---|---|---|
| DEEP HOLE (CS) | | | |
| Si RECESS | 30 nm | 143 nm (Δ 113 nm) | 60 nm (Δ 30 nm) |
| SHALLOW HOLE (CC) | | | |
| W LOSS | 4 nm | 24 nm (Δ 20 nm) | 8 nm (Δ 4 nm) |
| Si/W SEL. | – | 5.7 | 7.5 |

ETCHING METHOD AND PLASMA PROCESSING APPARATUS

CROSS-REFERENCE TO RELATED APPLICATION

The present application is based on and claims the benefit of priority to Japanese Patent Application No. 2016-235363 filed on Dec. 2, 2016, the entire contents of which are hereby incorporated by reference.

BACKGROUND OF THE INVENTION

1. Field of the Invention

The present invention relates to an etching method and a plasma processing apparatus.

2. Description of the Related Art

Manufacturing a three-dimensional (3D) stacked semiconductor memory, such as a 3D-NAND flash memory, includes an etching process for forming a plurality of holes as an etching pattern in a stacked film using a plasma (see, e.g., Japanese Unexamined Patent Publication No. 2009-170661, Japanese Unexamined Patent Publication No. 2009-266944, and Japanese Unexamined Patent Publication No. 2014-90022). Such an etching process may involve forming holes exposing respective layers of a multilayer film structure made up of 60 or more layers, for example.

As an example of an etching step for forming a 3D-NAND device structure, when etching holes in a $SiO_2$ layer corresponding to an insulating film, etching may be performed at the same time at a high selectivity of the $SiO_2$ layer with respect to a silicon layer corresponding to a substrate and a metal layer corresponding to an intermediate layer arranged in the middle of the $SiO_2$ layer. In such an etching step, a relatively shallow hole exposing the metal layer arranged in the middle of the $SiO_2$ layer is formed, and a deep hole exposing the silicon layer arranged beneath the metal layer is formed.

After the metal layer and the silicon layer are exposed by the above etching step, a step of further etching the silicon layer to form a recess (hereinafter referred to as "Si recess") in the silicon layer is performed in order to lower contact resistance.

In the step of forming the Si recess, the silicon layer needs to be removed through etching while preventing the exposed metal layer from being removed. That is, a process with a high etch selectivity of the silicon layer to the metal layer is desired in the step of forming the Si recess.

However, when a processing gas containing a fluorine gas (e.g., $CF_4$ gas, Ar gas, and $O_2$ gas) is used in the step of forming the Si recess, the metal layer may also be removed along with the silicon layer, and it is difficult to increase the selectivity of the silicon layer to the metal layer.

SUMMARY OF THE INVENTION

One aspect of the present invention is directed to providing a technique for improving the selectivity of the silicon layer to the metal layer.

According to an embodiment of the present invention, an etching method is provided for processing a substrate that includes a first region having an insulating film arranged on a silicon layer and a second region having the insulating film arranged on a metal layer. The etching method includes a first step of etching the insulating film into a predetermined pattern using a plasma generated from a first gas until the silicon layer and the metal layer are exposed, and a second step of further etching the silicon layer after the first step using a plasma generated from a second gas including a bromide-containing gas.

BRIEF DESCRIPTION OF THE DRAWINGS

FIG. 2 is a diagram showing an example result of etching of a deep hole and a shallow hole using a conventional gas;

FIG. 4 is a diagram showing an example Si/W selectivity when etching is performed using HBr according to an embodiment of the present invention;

FIG. 5 is a diagram showing examples of the Si/W selectivity when etching is performed using various gases;

FIG. 7 is a diagram showing examples of the Si/W selectivity when $C_4F_6$ gas is added to the HBr gas according to an embodiment of the present invention;

FIG. 10 is a diagram showing an example of the Si/W selectivity when $CH_4$ gas is added to the HBr gas according to an embodiment of the present invention.

DESCRIPTION OF THE PREFERRED EMBODIMENTS

Figure 1:
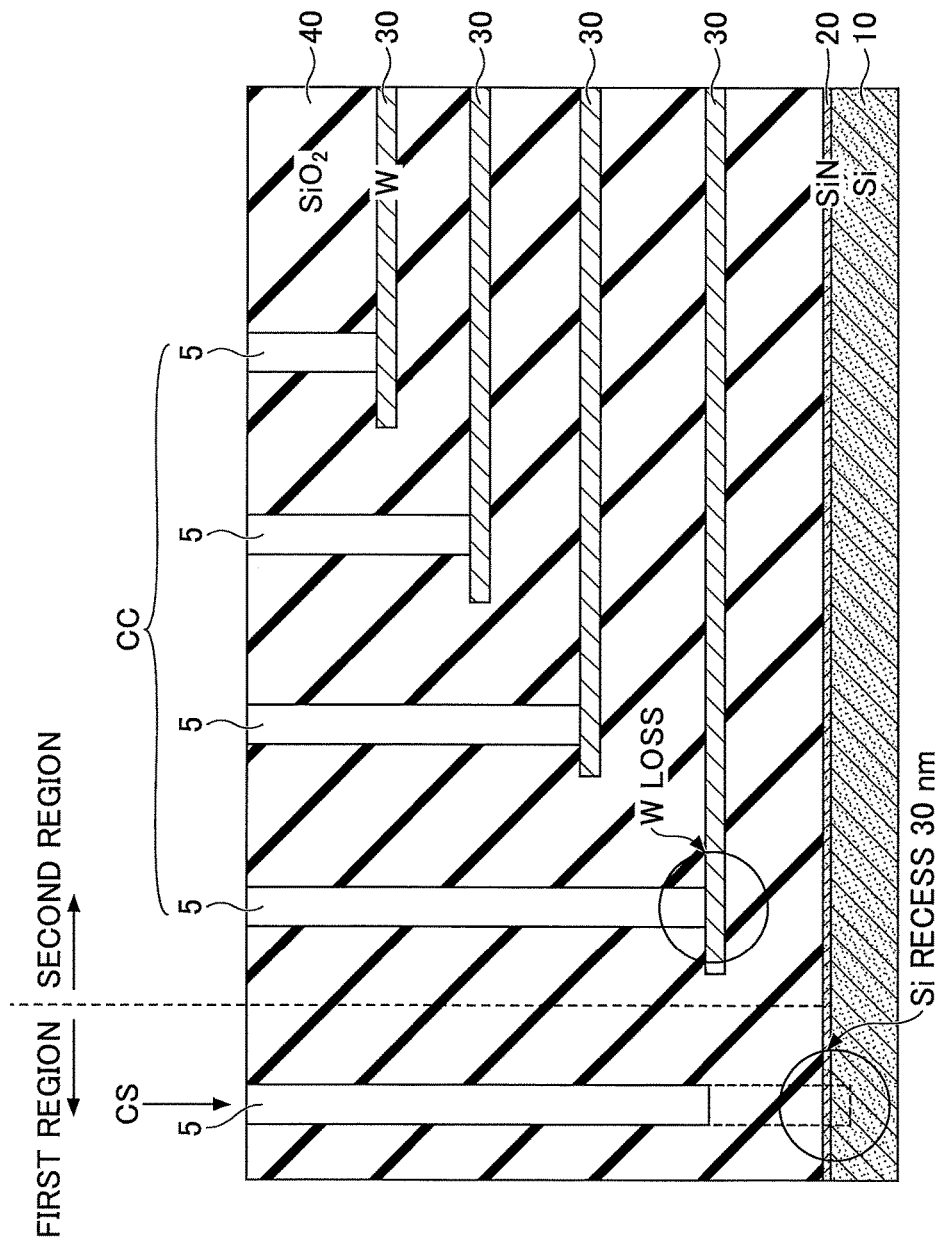
FIG. 1 is a diagram showing an example of a multilayer film of a 3D-NAND flash memory and holes formed therein according to an embodiment of the present invention.

In the following, embodiments of the present invention will be described with reference to the accompanying drawings. Note that in the following descriptions and the drawings, elements having substantially identical features are given the same reference numerals and overlapping descriptions may be omitted.

Manufacturing a device, such as a 3D-NAND flash memory, includes an etching process for forming a plurality of holes in a stacked film using a plasma. In such an etching process, holes (contact holes) 5 may be formed by etching a $SiO_2$ layer 40 into a predetermined etching pattern (mask pattern) as illustrated in FIG. 1, for example. At this time, a silicon (Si) layer 10 and an intermediate metal layer 30 (e.g., tungsten (W) layer) may be etched at the same time. In the example of FIG. 1, four layers of the metal layer 30 and the $SiO_2$ layer 40 are stacked one on top of the other. However, the structure of the stacked film to which the present invention is applied is not limited to such a stacked structure, and the stacked film may have a multi-layer structure including 60 layers to 100 layers, for example. In FIG. 1, the hole 5 exposing the silicon layer 10 is a deep hole (hereinafter referred to as "deep hole CS"), and the holes 5 exposing the metal layer 30 are holes shallower than the deep hole CS (hereinafter referred to as "shallow hole CC").

In the example of FIG. 1, a SiN layer 20 is arranged between the $SiO_2$ layer 40 and the silicon (Si) layer 10 in the deep hole CS. The SiN layer 20 is used as an etching stop layer when etching the $SiO_2$ layer 40 of the deep hole CS. The etching of the $SiO_2$ layer 40 is performed under an etching condition with high selectivity of SiO2 to SiN until the SiN layer 20 is exposed. Then, etching of the SiN layer 20 is performed under an etching condition for removing the SiN layer 20 to expose the underlying silicon layer 10. Note that in some embodiments, the SiN layer 20 may also be provided between the $SiO_2$ layer 40 and the metal layer 30 of the shallow hole CC, for example.

Note that the deep hole CS has to be etched deeper than the shallow hole CC, and as such, etching of the deep hole CS is continued even after etching of the shallow hole CC is completed. When the etching of the deep hole CS is completed and the silicon layer 10 is exposed, the surface of the silicon layer 10 may be damaged to thereby cause an increase in contact resistance. Thus, after the metal layer 30 is exposed in the shallow hole CC and the silicon layer 10 is exposed in the deep hole CS, in order to lower the contact resistance, the silicon layer is further etched to remove the surface of the silicon layer has been damaged and thereby form a recess (Si recess) in the silicon layer. In the process of forming the Si recess, the process conditions have to be adjusted so that the underlying metal layer 30 exposed in the shallow hole CC will not be removed during the Si recess forming process.

FIG. 2 shows an example result of performing the Si recess forming process using a conventional gas. In an initial state as shown on the left side column of FIG. 2, 30 nm of the silicon layer 10 is removed in the deep hole CS, and 4 nm of the tungsten (W) metal layer 30 is removed (lost) in the shallow hole CC.

On the other hand, it can be appreciated from the right side column of FIG. 2 that when the etching process for forming the Si recess is performed under conventional conditions (reference conditions) using a plasma generated from a gas mixture containing $CF_4$ (carbon tetrafluoride) gas, Ar (argon) gas, and $O_2$ (oxygen) gas, 28 nm (=58−30 nm) of the silicon layer 10 is further removed from the initial state to form a Si recess of 58 nm in the deep hole CS, and 22 nm (=26−4 nm) of tungsten (W) is further removed (lost) from the metal layer 30 in the shallow hole CC.

Note that the selectivity of silicon (Si) to tungsten (W) (hereinafter referred to as "Si/W selectivity") is 1.3 in the above-described etching process for forming the Si recess. That is, when the Si recess is formed in the silicon layer 10 using a plasma generated from a gas mixture of $CF_4$ gas, Ar gas, and $O_2$ gas, the Si/W selectivity cannot be increased to a desirably high value and the metal layer 30 cannot be adequately prevented from being removed during the etching process. In this respect, in an etching method according to an embodiment of the present invention, gas conditions are adjusted so that the Si/W selectivity may be greater than or equal to 5 so that the Si recess can be formed without substantially removing the metal layer 30.

In the following, the overall configuration of a plasma processing apparatus 1 that implements the etching method according to the present embodiment will be described. Thereafter, candidate gases that may be used to form the Si recess without substantially removing the metal layer 30 will be selected, etching results obtained by using the candidate gases will be evaluated, and gases to be used in the process of forming the Si recess will be specified.

[Overall Configuration of Plasma Processing Apparatus]

First, the overall configuration of the plasma processing apparatus 1 according to an embodiment of the present invention will be described with reference to FIG. 3. Note that in the descriptions below, it is assumed that the plasma processing apparatus 1 is a capacitively coupled plasma etching apparatus.

However, the plasma processing apparatus 1 according to the present embodiment is not limited to an etching apparatus for etching a semiconductor wafer W (hereinafter also referred to as "wafer W"). For example, the plasma processing apparatus 1 may be a film forming apparatus for forming a film on a wafer W by CVD (Chemical Vapor Deposition). The plasma processing apparatus 1 may also be a film forming apparatus for forming a film on a wafer W by PVD (Physical Vapor Deposition), an atomic layer etching (ALE) apparatus, or an atomic layer deposition (ALD) apparatus, for example.

The plasma processing apparatus 1 includes a processing chamber 2 made of a conductive material such as aluminum and a gas supply source 11 for supplying a gas to the interior of the processing chamber 2. The processing chamber 2 is electrically grounded. A lower electrode 21 and an upper electrode 22 disposed in parallel and facing each other are arranged in the processing chamber 2. The lower electrode 21 also functions as a pedestal on which a wafer W is placed. The gap (plasma space) between the lower electrode 21 and the upper electrode 22 may be 40 nm, for example.

A first radio frequency power source 32 is connected to the lower electrode 21 via a first matching unit 33, and a second radio frequency power source 34 is connected via a second matching unit 35. The first radio frequency power supply 32 applies a first radio frequency power (radio frequency power HF for plasma generation) having a frequency of 100 MHz, for example, to the lower electrode 21. The second radio frequency power supply 34 applies a second radio frequency power (radio frequency power LF for ion attraction) with a frequency lower than 100 MHz, such as 3 MHz, to the lower electrode 21.

The first matching unit 33 matches the load impedance with the internal (or output) impedance of the first radio frequency power supply 32. The second matching unit 35 matches the load impedance with the internal (or output) impedance of the second radio frequency power supply 34. In this way, when a plasma is generated in the processing chamber 2, the first matching unit 33 functions so that the internal impedance of the first radio frequency power supply 32 apparently matches the load impedance and the second matching unit 35 functions so that the internal impedance of the second radio frequency power supply 34 apparently matches the load impedance.

The upper electrode 22 is attached to a ceiling portion of the processing chamber 2 via a shield ring 41 that covers an outer edge of the upper electrode 22. A diffusion chamber 50 for diffusing gas introduced from the gas supply source 11 is arranged in the upper electrode 22. A gas introduction port 45 is formed in the diffusion chamber 50. Gas output from the gas supply source 11 is supplied to the diffusion chamber 50 via the gas introduction port 45 and is then passed through gas flow paths 55 to be supplied to a plasma space between the lower electrode 21 and the upper electrode 22 via openings 28. In this way, the upper electrode 22 also functions as a gas shower head for supplying gas to the plasma space.

An exhaust port 60 is formed on a bottom surface of the processing chamber 2, an exhaust device 65 is connected to the exhaust port 60 so that gas inside the processing chamber 2 may be evacuated. In this way, the interior of the processing chamber 2 can be maintained at a predetermined degree of vacuum. A gate valve G is arranged on a side wall of the processing chamber 2. The gate valve G opens and closes when loading/unloading the wafer W into/out of the processing chamber 2.

[Hardware Configuration of Control Device]

The plasma processing apparatus 1 includes a control device 100 for controlling the overall operation of plasma processing apparatus 1. The control device 100 includes a CPU (Central Processing Unit) 101, a ROM (Read Only Memory) 102, and a RAM (Random Access Memory) 103.

The ROM 102 stores basic programs to be executed by the control device 100, for example. The RAM 103 stores a recipe for a process. Note that control information for the plasma processing apparatus 1 according to process conditions (etching conditions) of the process is specified in the recipe. The control information may include information items, such as process time, pressure (gas exhaust), radio frequency power and voltage, gas flow rates of various gases, and temperatures within the chamber (e.g., upper electrode temperature, chamber side wall temperature, prescribed wafer temperature), for example. Note that in some embodiments, the recipe may be stored in a hard disk or a semiconductor memory, for example. Also, the recipe may be stored in a portable computer-readable storage medium, such as a CD-ROM or a DVD, and loaded in a predetermined position of a storage area of the plasma processing apparatus 1, for example.

The CPU 101 performs overall control of the plasma processing apparatus 1 based on the basic programs stored in the ROM 102. The CPU 101 also controls a desired process, such as an etching process for etching the wafer W, by controlling the supply of a predetermined type of gas based on the recipe stored in the RAM 103, for example.

[Gas Adjustment and Etching Method]

In the following, gas adjustment for forming a Si recess without substantially removing the metal layer 30 and an etching method for forming the Si recess to be implemented by the plasma processing apparatus 1 having the above-described configuration will be described. The etching method according to the present embodiment includes a first step of etching the $SiO_2$ layer 40 and the SiN layer 20 as shown in FIG. 1 using a plasma generated from a first gas until the silicon layer 10 and the metal layer 30 are exposed.

Then, after the first step, a second step of further etching the silicon layer 10 using a plasma generated from a second gas containing HBr gas (bromide-containing) is performed. Note that in the present embodiment, the first step and the second step are performed by the same plasma processing apparatus 1.

Also, note that although the $SiO_2$ layer 40 and the SiN layer 20 are described as example insulating films according to the present embodiment, the insulating film is not limited thereto and may also be a $SiO_x$ layer or some other oxide layer, a SiC layer, a SiCN layer, or a SiOCH layer, for example. Also, although the metal layer 30 is made of tungsten (W) in the present embodiment, the metal layer is not limited thereto and may also be made of titanium (Ti), aluminum (Al), ruthenium (Ru), or copper (Cu), for example.

Also, in the present embodiment, the aspect ratio of the hole 5 exposing the silicon layer 10 in a first region is greater than or equal to 45, and the aspect ratio of the hole 5 exposing the metal layer 30 in a second region is greater than or equal to 4.

The first step is a preparation step for performing the second step of etching the Si recess. In the first step, the shallow hole CC is etched until it reaches the metal layer 30 made of tungsten (W) so that the metal layer 30 is exposed, and the deep hole CS is etched until it reaches the silicon layer 10 so that the silicon layer 10 is exposed.

The first gas used in the first step may be a gas containing a fluorocarbon gas and an oxygen-containing gas, for example. Examples of fluorocarbon gases include $CF_4$ gas, $C_4F_8$ gas, and $C_4F_6$ gas. An example of an oxygen-containing gas includes $O_2$ gas. Also, the first gas may be a fluorohydrocarbon gas. Examples of fluorohydrocarbon gases include $CHF_3$ gas and $CH_2F_2$ gas. Further, a rare gas, such as argon (Ar) gas may be added to the first gas.

After the first step is completed, the second step of etching the Si recess is performed. The second gas used in the second step is a gas adjusted to have a Si/W selectivity greater than or equal to 5.

(Gas Adjustment)

FIG. 4 shows examples of the Si/W selectivity when etching for forming the Si recess was performed using various candidate gases in the plasma processing apparatus 1 according to the present embodiment. In FIG. 4, the candidate gases include HBr gas, a gas mixture of $Cl_2$ (chlorine) gas and Ar gas, a gas mixture of $SiCl_4$ (silicon tetrachloride) gas and Ar gas, and a gas mixture of $SiF_4$ (silicon tetrafluoride) gas and Ar gas.

The leftmost column of FIG. 4 shows cross-sectional views of the deep hole CS and the shallow hole CC in their initial states after the first step has been completed. At this point, the Si recess formed in the deep hole CS is 30 nm, and the tungsten (W) loss in the shallow hole CC exposing the metal layer is 4 nm.

Upon performing etching in the second step using the above candidate gases, the following results were obtained. When etching was performed using HBr gas in the second step, the Si recess of the deep hole CS was further etched to 143 nm (a difference of 113 nm from the initial state), and the tungsten (W) loss was 24 nm (a difference of 20 nm from the initial state). Also, the Si/W selectivity was 5.7 (=113/20). It can be appreciated from the above that by performing etching using HBr gas in the second step, the Si recess can be formed in the silicon layer 10 without substantially removing tungsten W metal layer.

Note that when the other candidate gases were used for etching in the second step, the Si/W selectivity was below 5 or the Si/W selectivity could not be properly evaluated due to generation of deposits. The above results indicate that by etching the silicon layer with a plasma generated from a second gas containing HBr gas in the second step after performing the first step, the Si recess can be formed without substantially removing tungsten W. Also, by using the second gas containing HBr gas, bowing can be prevented and the etched hole may have a substantially vertical shape as shown in FIG. 4.

Also, in addition to the candidate gases indicated in FIG. 4, $CHF_3$ (fluoroform) gas, $CH_2F_2$ (difluoromethane) gas, a gas mixture of $NF_3$ (nitrogen trifluoride) gas and Ar gas, and a gas mixture of $SF_6$ (sulfur hexafluoride) and Ar gas were selected as additional candidate gases, and the second step was performed using these additional candidate gases. FIG. 5 shows example results of performing the second step using the above candidate gases.

(HBr Gas)

Among the candidate gases shown in FIG. 5, only HBr gas could achieve a Si/W selectivity greater than 5. It can be appreciated from the above that among the candidate gases, HBr gas is preferably used in the second step. Note that FIGS. 4 and 5 show etching results of performing the second step with the etching time set to 90 seconds.

Figure 6A:
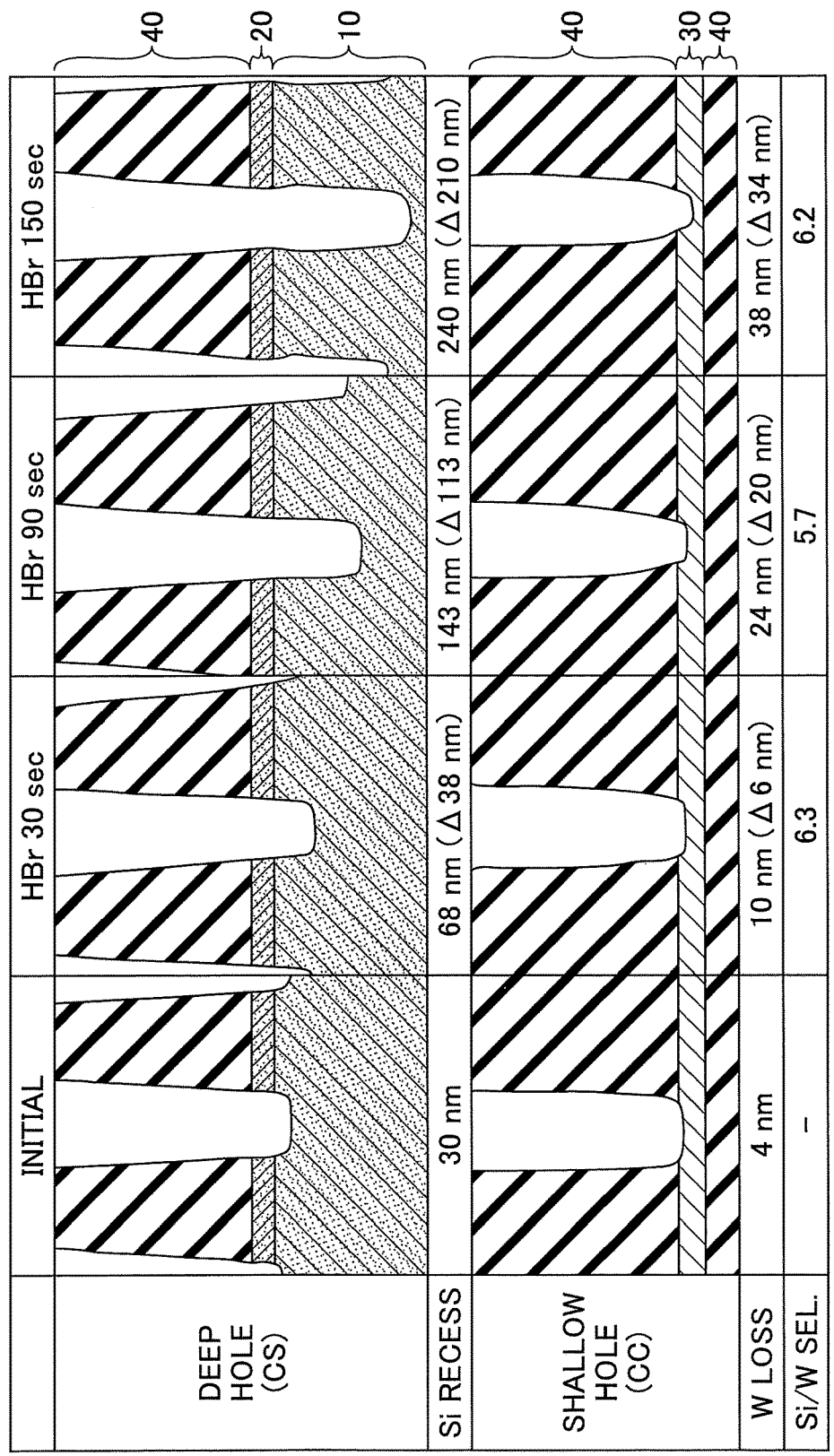
FIGS. 6A and 6B are diagrams showing example results of etching for different etching times using HBr gas according to an embodiment of the present invention.
Figure 6B:
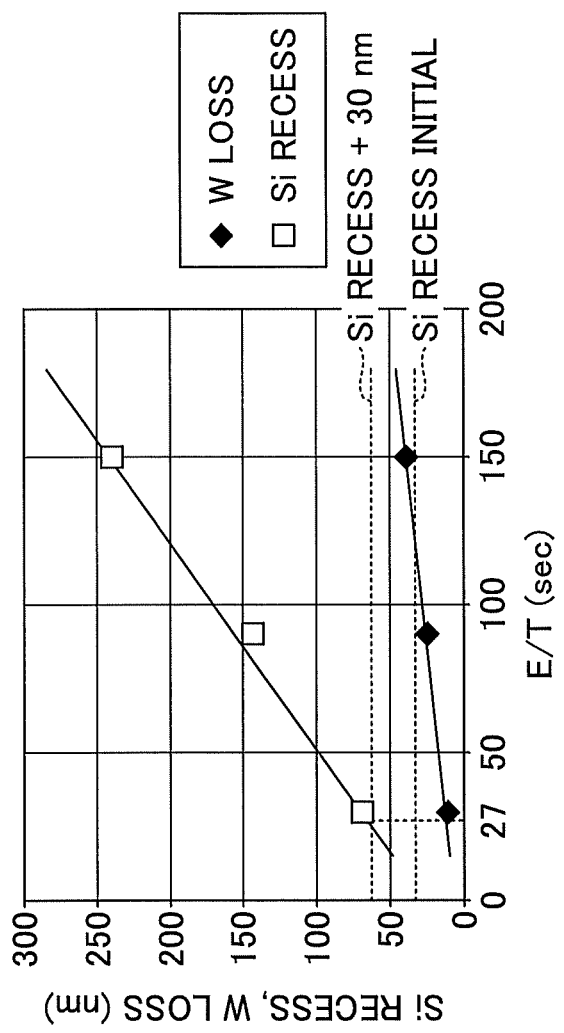

FIGS. 6A and 6B show etching results of performing the second step using HBr gas for various etching times. FIG. 6A show cross-sectional views of the Si recess in the deep hole CS and the bottom portion of the shallow hole CC when the second step was performed using HBr gas with the etching time set to 30 seconds, 90 seconds, and 150 seconds. The leftmost column of FIG. 6A shows cross-sectional views of the Si recess in the deep hole CS and the tungsten (W) loss in the shallow hole CC in their initial states; i.e., where the Si recess is 30 nm, and the tungsten (W) loss is 4 nm. The columns on the right side thereof show the Si recess and the tungsten (W) loss when the second step was performed using HBr gas with the etching time set to 30 seconds, 90 seconds, and 150 seconds. When the etching time was set to 30 seconds, the Si recess was 68 nm (a difference of 38 nm from the initial state), and the tungsten (W) loss was 10 nm (a difference of 6 nm from the initial state). When the etching time was set to 90 seconds and 150 seconds, the Si recess and tungsten (W) loss increased in proportion to the increase in the etching time. FIG. 6B is a graph indicating the Si recess and the W loss in relation to the etching time. In the graph of FIG. 6B, the horizontal axis represents the etching time (E/T), and the vertical axis represents the Si recess and the tungsten (W) loss. It can be appreciated from FIG. 6B that the Si recess and tungsten W loss change in proportion to the etching time. In other words, the Si/W selectivity does not change depending on the etching time.

In the present embodiment, a desired decrease in contact resistance can be achieved when the Si recess is 30 nm in the initial state and the Si recess is further etched by 30 nm from the initial state; i.e., when the Si recess is 60 nm (a difference of 30 nm from the initial state). Because the Si/W selectivity does not change depending on the etching time as described above, it can be estimated, based on the etching results indicated in the graph of FIG. 6B, that a desired Si recess shape can be obtained by setting the etching time to 27 seconds (corresponding to the point of intersection between the line representing the etching result of the Si recess and the horizontal line representing 60 nm).

(HBr Gas+Added Gas: $C_4F_6$)

In the following, results of performing the second step by adding $C_4F_6$ gas to the HBr gas will be described. FIG. 7 shows examples of the Si/W selectivity when $C_4F_6$ gas was added to the HBr gas at various flow rate ratios. Note that FIGS. 7-11 show etching results of performing the second step with the etching time set to 90 seconds.

The leftmost column of FIG. 7 shows the initial states of the Si recess and the W loss, and the columns to the right side thereof show example etching results of performing the second step by adjusting the flow rate ratio of the $C_4F_6$ gas (added gas) to the HBr gas to "0 (no addition)", "0.035", and "0.070".

When $C_4F_6$ gas was not added to the HBr gas, the Si/W selectivity was "5.7" as described above. In contrast, when the flow rate ratio of the $C_4F_6$ gas to the HBr gas was "0.035", the Si/W selectivity was "6.4". Further, when the flow rate ratio of the $C_4F_6$ gas to the HBr gas was "0.070", the Si/W selectivity was "19". It can be appreciated from these results that the Si/W selectivity can be further improved by adding $C_4F_6$ gas to the HBr gas.

Such an improvement in the Si/W selectivity resulting from adding $C_4F_6$ gas to the HBr gas may be attributed to the adhesion of $C_4F_6$ gas deposits generated during etching onto the tungsten (W) metal layer. As such, the gas to be added to the HBr gas is not limited to $C_4F_6$ gas, and some other fluorocarbon gas that undergoes deposition, such as $C_4F_6$ or $C_5F_8$, may be added to the HBr gas, for example. In this way, the Si/W selectivity can be similarly improved.

Figure 8:
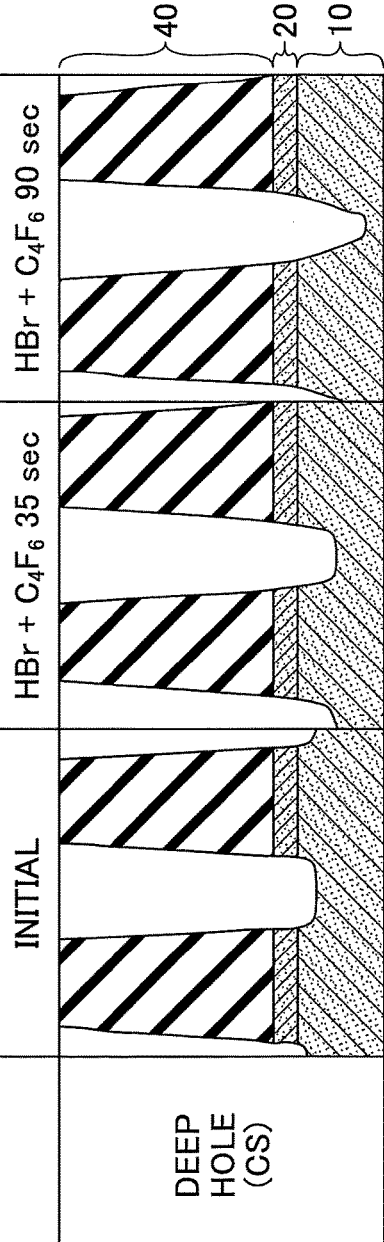
FIG. 8 is a diagram showing example results of etching for different etching times when $C_4F_6$ gas is added to the HBr gas.

FIG. 8 shows example etching results of performing the second step by adding $C_4F_6$ gas to the HBr gas according to the present embodiment and varying the etching time. The leftmost column of FIG. 8 shows the Si recess and the W loss in their initial states, and the columns to the right side thereof show etching results of the Si recess and the W loss in cases where the second step was performed using HBr gas containing $C_4F_6$ gas as the added gas with the etching time set to 35 seconds and 90 seconds. Note that the flow rate ratio of the $C_4F_6$ gas to the HBr gas was the same in both of the above cases.

When the etching time was 30 seconds, the Si recess was 60 nm (a difference of 30 nm from the initial state) and the tungsten (W) loss was 6 nm (a difference of 2 nm from the initial state). When the etching time was 90 seconds, the Si recess was 107 nm (a difference of 77 nm from the initial state) and the tungsten (W) loss was 8 nm (a difference of 4 nm from the initial state). It can be appreciated from these results that the Si recess and the tungsten (W) loss change in proportion to the etching time. In other words, the Si/W selectivity does not change depending on the etching time.

(HBr Gas+Added Gas: $CH_2F_2$)

Figure 9A:
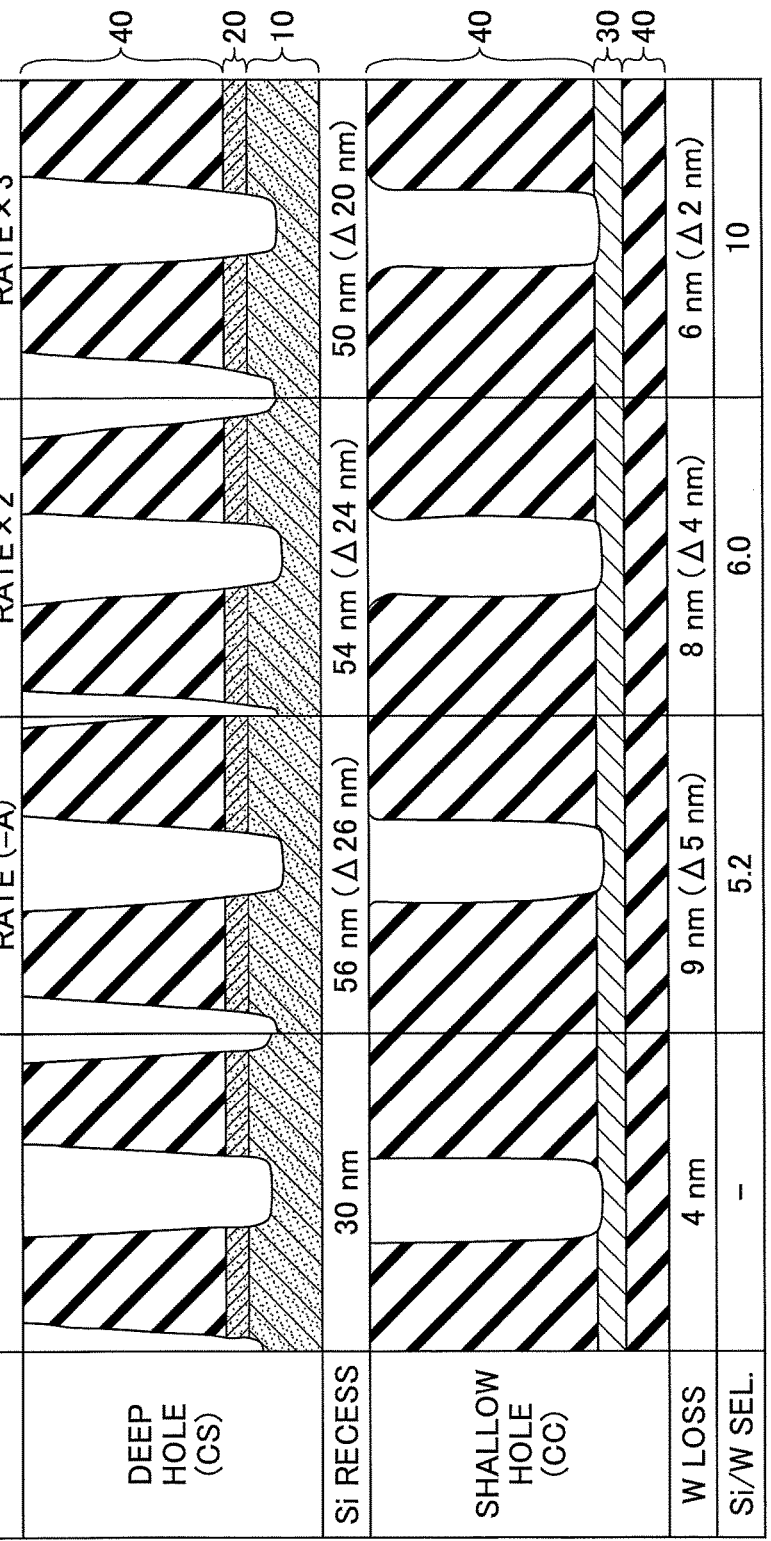
FIGS. 9A and 9B are diagrams showing examples of the Si/W selectivity when $CH_2F_2$ gas is added to the HBr gas according to an embodiment of the present invention.

In the following, results of performing the second step by adding $CH_2F_2$ gas to the HBr gas will be described. FIG. 9A shows examples of the Si/W selectivity when adding $CH_2F_2$ gas to the HBr gas in performing the second step.

Figure 9B:
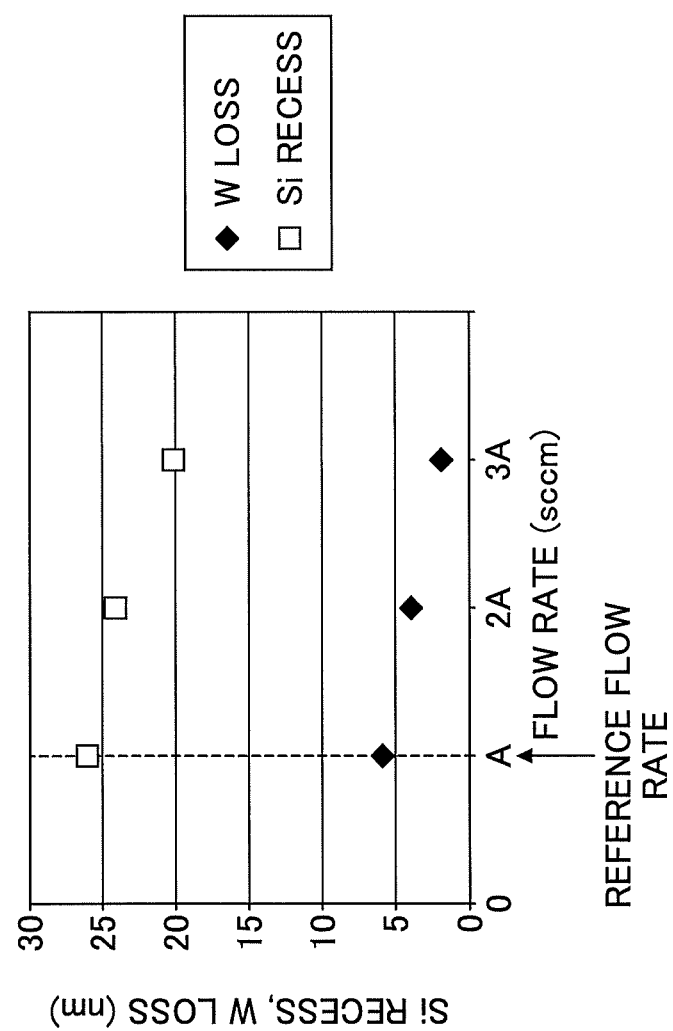

The leftmost column of FIG. 9A show the Si recess and the tungsten (W) loss in their initial states, and the columns to the right side thereof show etching results of performing the second step by adjusting the flow rate ratio of the $CH_2F_2$ gas to the HBr gas to "0.25", "0.5", and "0.75". FIG. 9B is a graph representing the above etching results. In the graph of FIG. 9B, the horizontal axis represents the $CH_2F_2$ gas flow rate based on a reference flow rate "A" corresponding to the $CH_2F_2$ gas flow rate when the flow rate ratio of the $CH_2F_2$ gas to the HBr gas is "0.25", and the vertical axis represents the Si recess and the tungsten (W) loss.

As shown in FIG. 9A, when the flow rate ratio of the $CH_2F_2$ gas to the HBr gas was "0.25", the Si/W selectivity was "5.2". Further, when the flow rate ratio of the $CH_2F_2$ gas to the HBr gas was "0.5", the Si/W selectivity was "6.0", and when the flow rate ratio of the $CH_2F_2$ gas to the HBr gas was "0.75", the Si/W selectivity was "10". It can be appreciated from these results that by adding $CH_2F_2$ gas to the HBr gas, the Si/W selectivity can be improved owing to the deposition of the $CH_2F_2$ gas.

Note that the gas to be added to the HBr gas is not limited to $CH_2F_2$ gas, and some other hydrofluorocarbon gas that undergoes deposition, such as $CHF_3$ or $CH_3F$, may be added to the HBr gas. In this way, the Si/W selectivity can be similarly improved.

(HBr gas+Added Gas: $CH_4$)

In the following, results of performing etching in the second step by adding $CH_4$ gas to the HBr gas will be described. FIG. 10 show an example of the Si/W selectivity when the second step is performed by adding $CH_4$ gas to the HBr gas. When $CH_4$ gas was not added to the HBr gas (see center column of FIG. 10), the Si/W selectivity was "5.7" as described above, whereas when $CH_4$ gas was added to the HBr gas (see right column of FIG. 10), the Si/W selectivity was "7.5". It can be appreciated from these results that the Si/W selectivity can be improved by adding $CH_4$ gas to HBr gas owing to the deposition of $CH_4$ gas.

Note that the gas added to the HBr gas is not limited to $CH_4$ gas, and some other hydrocarbon gas that undergoes deposition, such as $CH_4$, $C_2H_6$, or $C_3H_8$ may be added to the HBr gas. In this way, the Si/W selectivity can similarly be improved.

(HBr Gas+Added Gas+Ar Gas)

Figure 11:
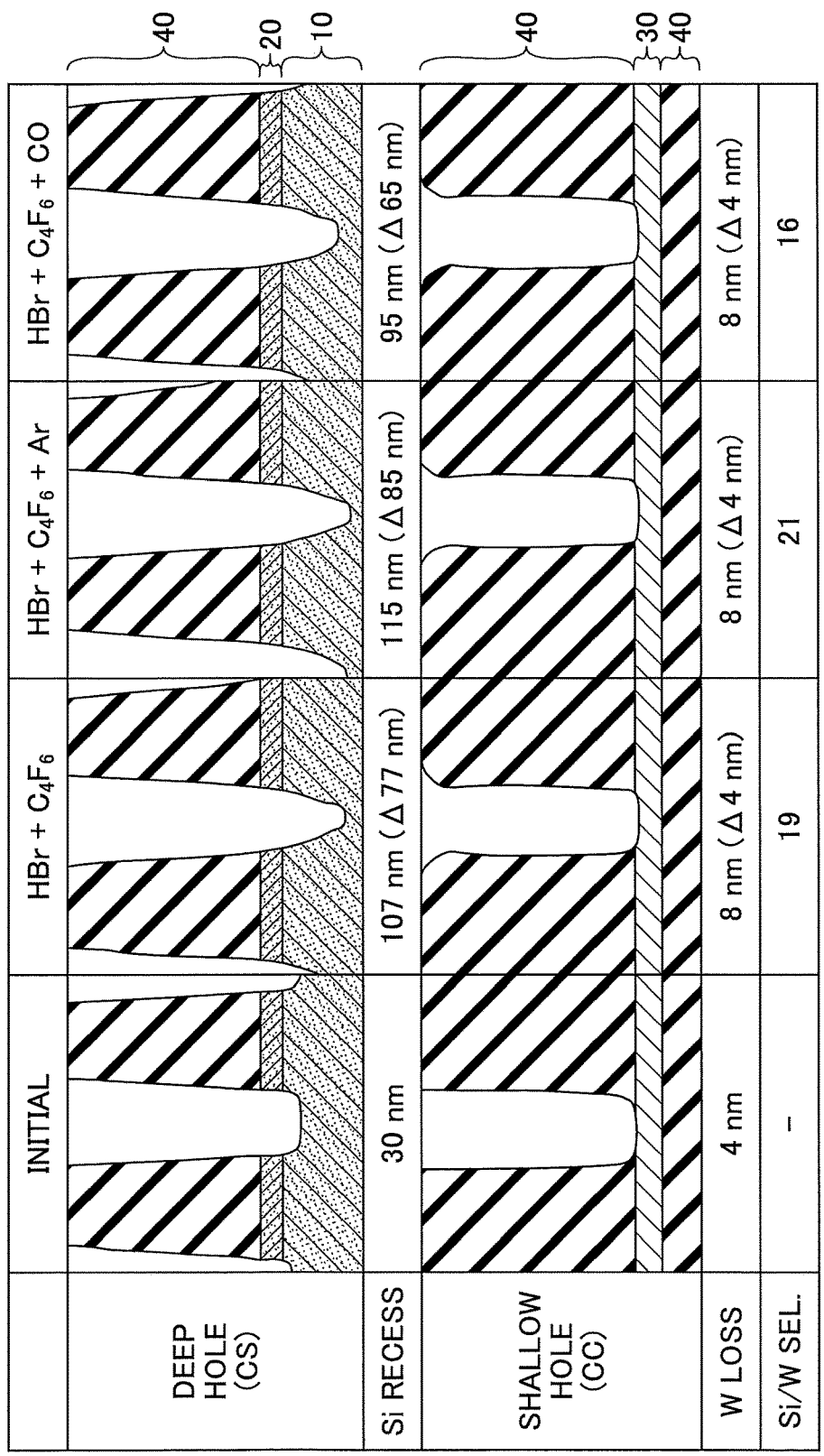
FIG. 11 is a diagram showing examples of the Si/W selectivity when $C_4F_6$ gas and Ar gas or CO gas are added to the HBr gas according to an embodiment of the present invention.

FIG. 11 shows example results of performing etching in the second step using a gas mixture obtained by adding $C_4F_6$ gas to the HBr gas and further adding Ar gas or CO (carbon monoxide) gas. As can be appreciated from these results, when a gas mixture obtained by adding $C_4F_6$ gas to the HBr gas and further adding Ar gas was used, the Si/W selectivity was "21", which is about the same level of improvement as the Si/W selectivity of "19" achieved in the case of adding $C_4F_6$ gas to the HBr gas.

Also, when a gas mixture obtained by adding $C_4F_6$ gas to the HBr gas and further adding CO gas was used, the Si/W selectivity was "16", which is about the same level of improvement as the Si/W selectivity of "19" achieved in the case of adding $C_4F_6$ gas to the HBr gas.

It can be appreciated from the above results that etching in the second step may be performed using a gas mixture obtained by adding $C_4F_6$ gas to the HBr gas and further adding Ar gas or CO gas. Further, etching in the second step may be performed using a gas mixture obtained by adding $C_4F_6$ gas to the HBr gas and further adding $CO_2$ gas in a manner similar to adding the CO gas, for example.

As described above, by implementing the etching method according to an embodiment of the present invention, the selectivity of the silicon layer to the metal layer can be improved. Also, bowing can be prevented and a substantially vertical etching shape can be obtained. Note that in the experiments described above, the sheath voltage applied to the wafer W was less than or equal to 900 V.

Although an etching method and a plasma processing apparatus according to the present invention have been described above with respect to certain illustrative embodiments, the etching method and the plasma processing apparatus according to the present invention are not limited to the above embodiments and various modifications and improvements may be made within the scope of the present invention. Also, the embodiments described above can be combined to the extent practicable.

Figure 3:
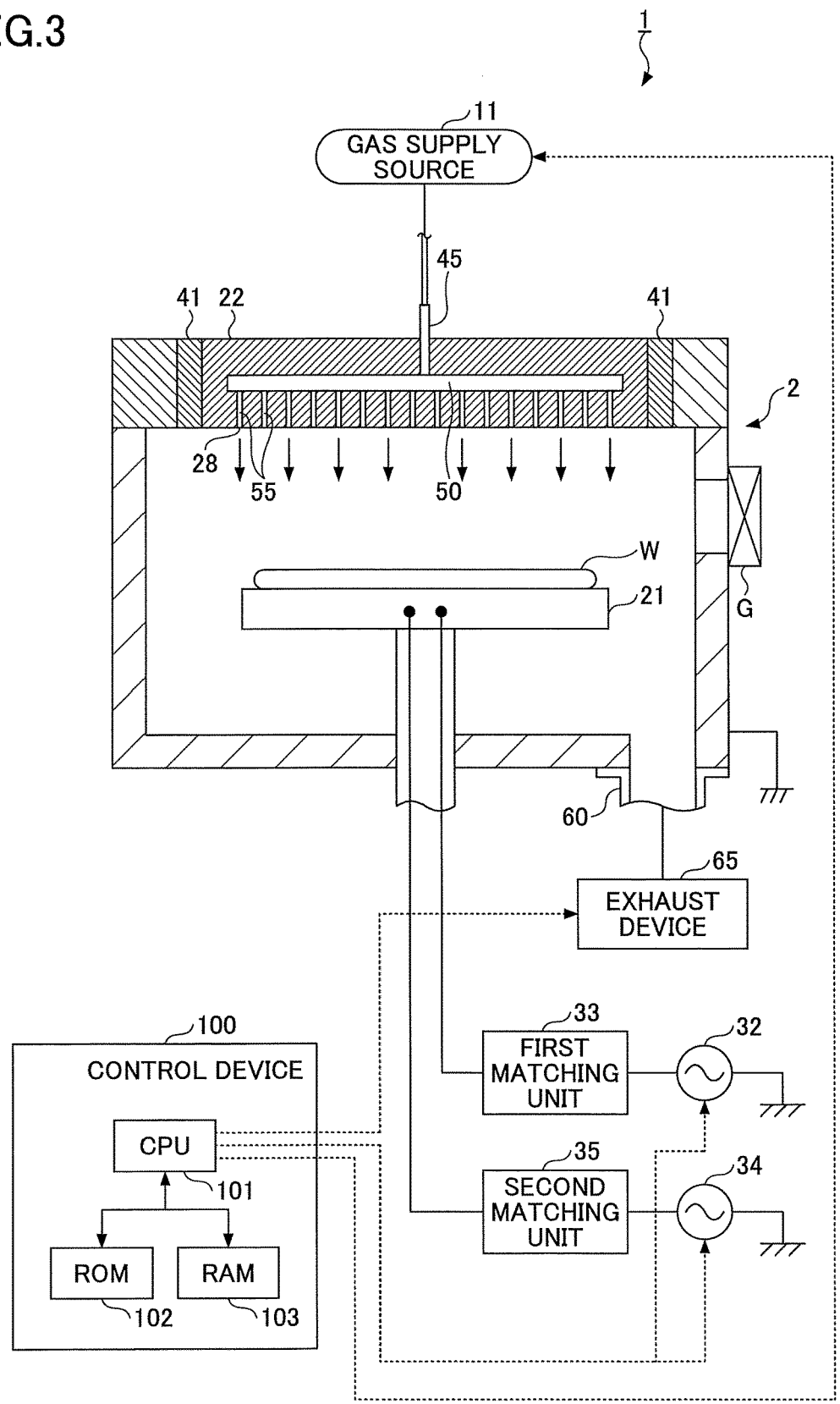
FIG. 3 is a diagram showing an example of a plasma processing apparatus according to an embodiment of the present invention.

For example, although a dual-frequency parallel-plate plasma processing apparatus is illustrated in FIG. 3 as an example of the plasma processing apparatus 1, the present invention can be applied to other types of plasma processing apparatuses, such as a capacitively coupled plasma (CCP) apparatus, an inductively coupled plasma (ICP) processing apparatus, a plasma processing apparatus using a radial line slot antenna, a helicon wave plasma (HWP) apparatus, an electron cyclotron resonance (ECR) plasma apparatus, a surface wave plasma processing apparatus and the like.

Also, although the wafer W is described as an example of a substrate to be processed, various other types of substrates, such as a substrate used in an LCD (Liquid Crystal Display) or a FPD (Flat Panel Display), a photomask, a CD substrate, or a printed circuit board, may be subjected to the etching method according to the present invention.

What is claimed is:

1. An etching method comprising:
providing a substrate that includes
a first region having an insulating film arranged on a silicon layer, and
a second region having the insulating film arranged on a metal layer;
etching the insulating film into a predetermined pattern using a plasma generated from a first gas until the silicon layer and the metal layer are exposed; and
etching the silicon layer after the etching of the insulating film using a plasma generated from a second gas including a bromine-containing gas, wherein
a selectivity of the bromine-containing gas of the second gas for etching the silicon layer to the metal layer is greater than or equal to 5 so that the silicon layer is etched without removing the metal layer.

2. The etching method according to claim 1, wherein the silicon layer is etched using a plasma generated from a gas mixture obtained by adding at least one gas selected from a group consisting of a fluorocarbon gas, a hydrofluorocarbon gas, and a hydrocarbon gas to the second gas.

3. The etching method according to claim 2, wherein the fluorocarbon gas added to the second gas is at least one gas selected from a group consisting of $C_4F_8$ gas, $C_4F_6$ gas, $C_5F_8$ gas, and $C_3F_8$ gas.

4. The etching method according to claim 2, wherein the hydrofluorocarbon gas added to the second gas is at least one gas selected from a group consisting of $CH_2F_2$ gas, $CHF_3$ gas, and $CH_3F$ gas.

5. The etching method according to claim 2, wherein the hydrocarbon gas added to the second gas is at least one gas selected from a group consisting of $CH_4$ gas, $C_2H_6$ gas, and $C_3H_8$ gas.

6. The etching method according to claim 2, wherein the gas mixture is obtained by adjusting a gas flow ratio of the gases of the second gas, in which at least one of the following gas flow ratios applies:
a gas flow ratio of the bromine-containing gas to the fluorocarbon gas is less than or equal to 0.07;
a gas flow ratio of the bromine-containing gas to the hydrofluorocarbon gas is less than or equal to 0.75; or
a gas flow ratio of the bromine-containing gas to the hydrocarbon gas is less than or equal to 0.25.

7. The etching method according to claim 1, wherein the metal layer is made of at least one element selected from a group consisting of tungsten (W), titanium (Ti), aluminum (Al), ruthenium (Ru), and copper (Cu).

8. The etching method according to claim 1, wherein
a first aspect ratio of the predetermined pattern formed in the first region after the silicon layer is exposed is greater than or equal to 45; and
a second aspect ratio of the predetermined pattern formed in the second region after the metal layer is exposed is greater than or equal to 4.

9. The etching method according to claim 1, wherein the first gas is a gas mixture including a fluorocarbon gas and an oxygen-containing gas.

10. The etching method according to claim 1, wherein the etching of the insulating film and the etching of the silicon layer are performed using a same plasma processing apparatus.

11. The etching method according to claim 1, wherein the first gas does not include bromine.

12. The etching method according to claim 1, wherein in etching the silicon layer, a recess is formed in the silicon layer by removing a surface of the silicon layer that has been damaged during the etching of the insulating film.

13. The etching method according to claim 1, wherein a sheath voltage of less than or equal to 900 V is applied to the substrate.

14. An etching method comprising:
providing a substrate that includes
  a first region having an insulating film arranged on a silicon-containing layer, and
  a second region having the insulating film arranged on a metal layer, the etching method;
etching the insulating film into a predetermined pattern using a plasma generated from a first gas until the silicon-containing layer and the metal layer are exposed; and
etching the silicon-containing layer after the etching of the insulating film using a plasma generated from a second gas including a bromine-containing gas, wherein
  the silicon-containing layer is etched in the etching of the silicon-containing layer using a plasma generated from a gas mixture obtained by adding at least one gas selected from a group consisting of a fluorocarbon gas, a hydrofluorocarbon gas, and a hydrocarbon gas to the second gas,
  a first aspect ratio of the predetermined pattern formed in the first region after the silicon-containing layer is exposed is greater than or equal to 45,
  a second aspect ratio of the predetermined pattern formed in the second region after the metal layer is exposed is greater than or equal to 4,
  a selectivity of the bromine-containing gas of the second gas for etching the silicon-containing layer to the metal layer is greater than or equal to 5 so that the silicon-containing layer is etched without removing the metal layer,
the first gas is a gas mixture including a fluorocarbon gas and an oxygen-containing gas, and
the etching of the insulating film and the etching of the silicon-containing layer are performed using a same plasma processing apparatus.

* * * * *